United States Patent
Hahn et al.

(10) Patent No.: US 11,227,629 B2
(45) Date of Patent: *Jan. 18, 2022

(54) METHOD OF MANUFACTURING PIEZOELECTRIC MICROACTUATORS HAVING WRAP-AROUND ELECTRODES

(71) Applicant: Magnecomp Corporation, Murrieta, CA (US)

(72) Inventors: Peter Hahn, Bangkok (TH); Kuen Chee Ee, Chino, CA (US); Long Zhang, Murrieta, CA (US)

(73) Assignee: Magnecomp Corporation, Murrieta, CA (US)

( * ) Notice: Subject to any disclaimer, the term of this patent is extended or adjusted under 35 U.S.C. 154(b) by 454 days.

This patent is subject to a terminal disclaimer.

(21) Appl. No.: 15/912,042

(22) Filed: Mar. 5, 2018

(65) Prior Publication Data

US 2018/0198057 A1    Jul. 12, 2018

Related U.S. Application Data

(60) Division of application No. 14/316,633, filed on Jun. 26, 2014, now Pat. No. 9,911,913, which is a
(Continued)

(51) Int. Cl.
*H01L 41/29* (2013.01)
*H01L 41/338* (2013.01)
(Continued)

(52) U.S. Cl.
CPC ............ *G11B 5/483* (2015.09); *G11B 5/4853* (2013.01); *G11B 5/4873* (2013.01); *H01L 41/29* (2013.01); *H01L 41/338* (2013.01);
*B29C 2793/0027* (2013.01); *B29C 2793/0036* (2013.01); *B32B 37/04* (2013.01); *B32B 37/1207* (2013.01); *B32B 37/1292* (2013.01); *B32B 38/0036* (2013.01); *B32B 38/10* (2013.01); *B32B 38/185* (2013.01); *B32B 2038/0076* (2013.01); *G11B 5/48* (2013.01); *G11B 5/4806* (2013.01);
(Continued)

(58) Field of Classification Search
CPC ..... H01L 41/29; H01L 41/047; H01L 41/338; Y10T 29/42
See application file for complete search history.

(56) References Cited

U.S. PATENT DOCUMENTS

| | | | |
|---|---|---|---|
| 4,383,363 A | 5/1983 | Hayakawa et al. | |
| 4,633,122 A | 12/1986 | Radice | |

(Continued)

OTHER PUBLICATIONS

Ablestik, "Ablecoat™ 8008NC,"—Developmental Technical Datasheet, Rancho Dominguez, CA.
(Continued)

*Primary Examiner* — Livius R. Cazan
(74) *Attorney, Agent, or Firm* — DLA Piper LLP (US)

(57) ABSTRACT

A method of manufacturing a piezoelectric microactuator having a wrap-around electrode includes forming a piezoelectric element having a large central electrode on a top face, and having a wrap-around electrode that includes the bottom face, two opposing ends of the device, and two opposing end portions of the top face. The device is then cut through the middle, separating the device into two separate piezoelectric microactuators each having a wrap-around electrode.

10 Claims, 14 Drawing Sheets

Related U.S. Application Data continuation of application No. 14/045,773, filed on Oct. 3, 2013, now Pat. No. 9,406,314.

(60) Provisional application No. 61/709,573, filed on Oct. 4, 2012.

(51) Int. Cl.

| | | |
|---|---|---|
| *G11B 5/48* | (2006.01) | |
| *B32B 38/00* | (2006.01) | |
| *G11B 5/56* | (2006.01) | |
| *B32B 38/18* | (2006.01) | |
| *B32B 37/12* | (2006.01) | |
| *G11B 21/10* | (2006.01) | |
| *G11B 5/55* | (2006.01) | |
| *B32B 37/04* | (2006.01) | |
| *B32B 38/10* | (2006.01) | |

(52) U.S. Cl.
CPC .......... *G11B 5/4846* (2013.01); *G11B 5/5552* (2013.01); *G11B 5/56* (2013.01); *G11B 21/10* (2013.01); *G11B 21/106* (2013.01); *Y10T 29/42* (2015.01); *Y10T 156/10* (2015.01); *Y10T 156/1052* (2015.01)

(56) References Cited

U.S. PATENT DOCUMENTS

| | | | |
|---|---|---|---|
| 4,762,747 A | 8/1988 | Liu et al. | |
| 5,126,615 A | 6/1992 | Takeuchi et al. | |
| 5,376,860 A | 12/1994 | Sato | |
| 5,440,075 A | 8/1995 | Kawakita et al. | |
| 6,108,175 A | 8/2000 | Hawwa et al. | |
| 6,315,856 B1 | 11/2001 | Asagiri et al. | |
| 6,393,681 B1 | 5/2002 | Summers | |
| 6,393,685 B1 | 5/2002 | Collins | |
| 6,703,767 B1 | 3/2004 | Summers | |
| 6,716,363 B1 | 4/2004 | Wright et al. | |
| 6,749,707 B2 | 6/2004 | Saksa et al. | |
| 6,767,079 B1 | 7/2004 | Moore | |
| 6,856,075 B1 | 2/2005 | Houk et al. | |
| 6,882,089 B2 | 4/2005 | Kashiwaya et al. | |
| 7,064,401 B2 | 6/2006 | Uchiyama et al. | |
| 7,161,797 B2 | 1/2007 | Vaisman et al. | |
| 7,167,344 B2 | 1/2007 | Nakagawa et al. | |
| 7,382,583 B2 | 6/2008 | Hirano et al. | |
| 7,449,032 B2 | 11/2008 | Vaisman et al. | |
| 7,459,835 B1 | 12/2008 | Mei et al. | |
| 7,485,971 B2 | 2/2009 | Fuller et al. | |
| 7,538,985 B2 | 5/2009 | Utsunomiya | |
| 7,580,226 B1 | 8/2009 | Yao et al. | |
| 7,596,859 B2 | 10/2009 | Yao et al. | |
| 7,630,175 B2 | 12/2009 | Yamazaki et al. | |
| 7,671,519 B2 | 3/2010 | Kear et al. | |
| 7,751,153 B1 | 7/2010 | Kulangara et al. | |
| 7,974,045 B2 | 7/2011 | Kwon et al. | |
| 8,053,956 B2 | 11/2011 | Bibl et al. | |
| 8,085,508 B2 | 12/2011 | Hatch | |
| 8,148,877 B2 | 4/2012 | Jiang et al. | |
| 8,189,301 B2 | 5/2012 | Schreiber | |
| 8,248,735 B2 | 8/2012 | Fujimoto et al. | |
| 8,317,961 B2 | 11/2012 | Kitada et al. | |
| 8,369,047 B2 | 2/2013 | Fujimoto et al. | |
| 8,399,059 B2 | 3/2013 | Steinfeldt et al. | |
| 8,526,142 B1 | 9/2013 | Dejkoonmak et al. | |
| 8,561,270 B2 | 10/2013 | Suarez et al. | |
| 8,570,688 B1 | 10/2013 | Hahn et al. | |
| 8,773,820 B1 | 7/2014 | Hahn et al. | |
| 9,406,314 B1 | 8/2016 | Hahn et al. | |
| 9,911,913 B1 | 3/2018 | Hahn et al. | |
| 10,381,027 B1 | 8/2019 | Hahn et al. | |
| 10,762,922 B2 | 9/2020 | Hahn et al. | |
| 2001/0028953 A1 | 10/2001 | Bluem et al. | |
| 2001/0046107 A1 | 11/2001 | Irie et al. | |
| 2002/0014815 A1 | 2/2002 | Kurano et al. | |
| 2003/0168006 A1 | 9/2003 | Williams | |
| 2004/0238595 A1 | 12/2004 | Nogiwa et al. | |
| 2005/0073552 A1 | 4/2005 | Smoot et al. | |
| 2007/0139848 A1 | 6/2007 | Harris et al. | |
| 2010/0177446 A1 | 7/2010 | Hancer et al. | |
| 2010/0327699 A1 | 12/2010 | Hassanali et al. | |
| 2011/0075301 A1 | 3/2011 | Tsuchiya et al. | |
| 2012/0073869 A1 | 3/2012 | Kishi et al. | |
| 2019/0362746 A1 | 11/2019 | Hahn et al. | |
| 2020/0075049 A1 | 3/2020 | Hahn et al. | |

OTHER PUBLICATIONS

A1 Technology, Inc, "Die Attach Adhesive FAQs".

Dow Corning, "Die Attach Adhesives," web page retrieved from: http://www.dowcorning.com/content/etronics/etronicsdieadh/.

Dragoi, V., et al., "Adhesive Wafer Bonding for Wafer-Level Fabrication of Microring Resonators," Romanian Journal of Information Science and Technology, vol. 10, No. 1, 2007, 3-11.

Dragoi, V., et al. "Adhesive wafer bonding using photosensitive polymer layers," Presented at SPIE—Microtechnologies for the New Millenium, symposia "Smart Sensors, Actuators, and MEMS," May 4-6, 2009, Dresden, Germany.

Epoxy Technology, Inc., "EPO-TEK H2OE Technical Data Sheet," Feb 2010, Epoxy Technology, Inc., Billerica, MA.

Gillen, Ken, "Step-by-Step: SMT—Adhesives/Epoxies and Dispensing" SNIT/May 1995, pp. 94.

Henkel Corporation, "Hysol Brochure," Henkel Americas, Europe, and Asia, www.henkel.com/electronics.

Kropp, Michael and Behr, Andrew, "Innovations in IC Packaging Adhesives," Electro IQ, http://www.electroiq.com/articles/ap/print/volume-14/issue . . . .

Nakada, Davy, "We've Got Your Back: Die Attach With Wafer Backside Coating," OnBoard Technology Jul. 2008—pp. 52-53.

Perelaer, Jolke and Schubert, Ulrich S., "Inkjet Printing and Alternative Sintering of Narrow Conductive Tracks on Flexible Substrates for Plastic Electronic Applications," Radio Frequency Identification Fundamentals and Applications, Design Methods and Solutions, pp. 265-286, Feb. 2010, Intech, Croatia.

Savastano, David, "The Conductive Ink Market," Ink World, http://www.inkworldmagazine.com/articles/2012/03/the-conductive-ink-market.

Schake, Jeff, "A Baseline Study on the Performance of Stencil and Screen Print Processes for Wafer Backside Coating," DEK USA Inc., Flemington, NJ USA.

Schake, Jeff, et al., "Tooling Influence on Stencil Print Coating Uniformity for 150 μm Thick 200mm Wafers," DEK Printing Machines Ltd., Weymouth, Dorset, United Kingdom.

Winster, Tony, et al., "Wafer Backside Coating Of Die Attach Adhesives New Method Simplifies Process, Saves Money".

Office Action in U.S. Appl. No. 14/045,773, dated Oct. 23, 2015.
Office Action in U.S. Appl. No. 14/045,773, dated Jan. 15, 2016.
Office Action in U.S. Appl. No. 14/045,773, dated Apr. 8, 2016.
Notice of Allowance in U.S. Appl. No. 14/045,773, dated Jun. 15, 2016.
Office Action in U.S. Appl. No. 14/316,633, dated Aug. 29, 2016.
First Action Interview Pilot Program Pre-Interview Communication in U.S. Appl. No. 14/316,633, dated Nov. 16, 2016.
First Action Interview Office Action Summary in U.S. Appl. No. 14/316,633, dated May 4, 2017.
Notice of Allowance in U.S. Appl. No. 14/316,633, dated Oct. 20, 2017.
Office Action in U.S. Appl. No. 15/191,464, dated Jun. 7, 2018.
Notice of Allowance in U.S. Appl. No. 14/182,285, dated May 23, 2014.
Office Action in U.S. Appl. No. 15/191,464, dated Sep. 17, 2018.
Notice of Allowance in U.S. Appl. No. 15/191,464, dated Apr. 23, 2019.
Supplemental Notice of Allowance in U.S. Appl. No. 15/191,464, dated Jun. 14, 2019.
Office Action in U.S. Appl. No. 16/538,780, dated Jan. 8, 2020.

(56) References Cited

OTHER PUBLICATIONS

Notice of Allowance in U.S. Appl. No. 16/538,780, dated Apr. 27, 2020.
International Search Report and Written Opinion in International Application No. PCT/US2021/014728, dated Mar. 31, 2021.

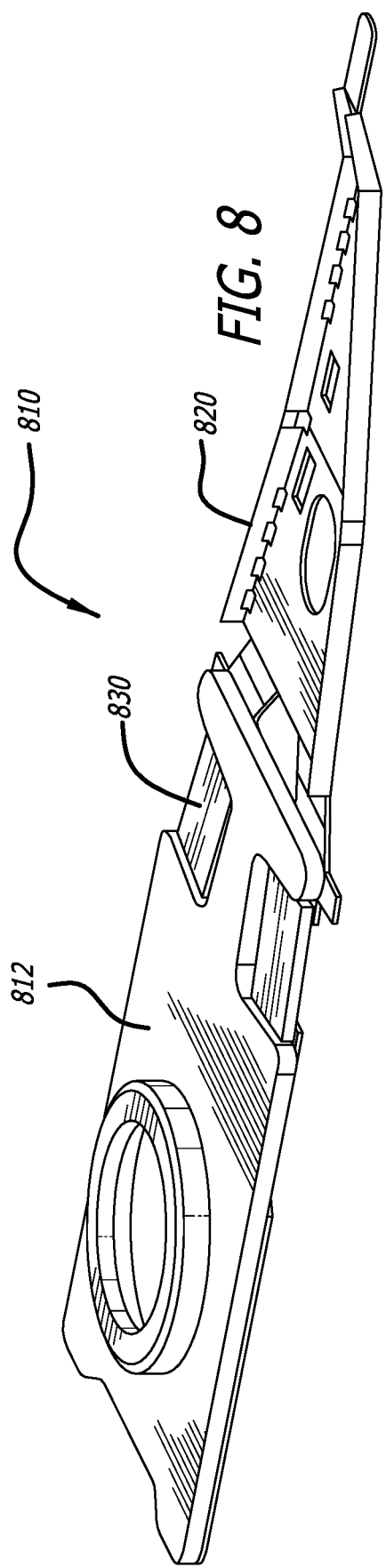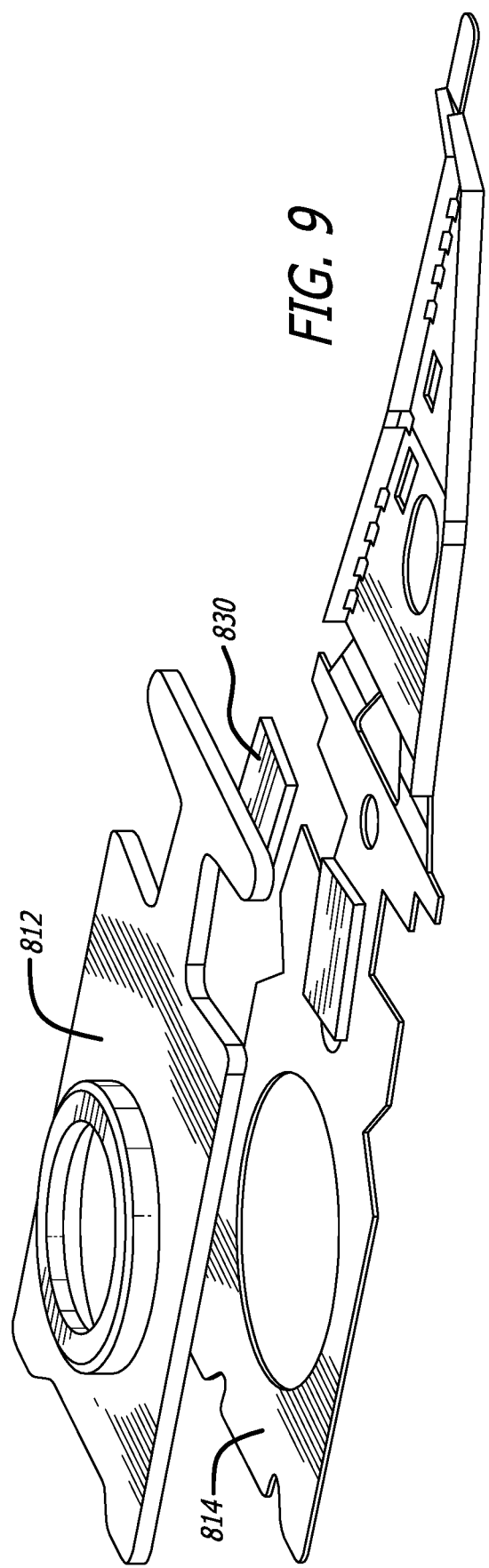

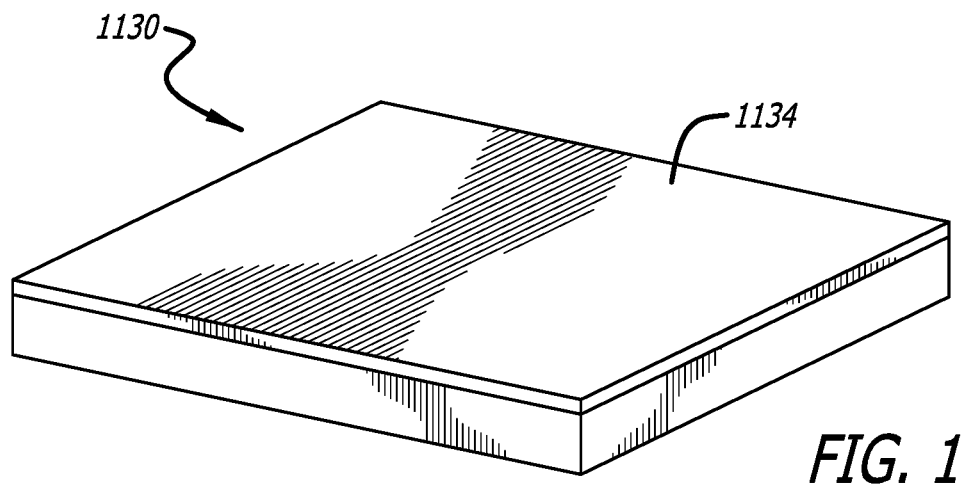
FIG. 12
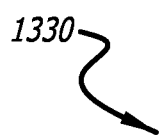
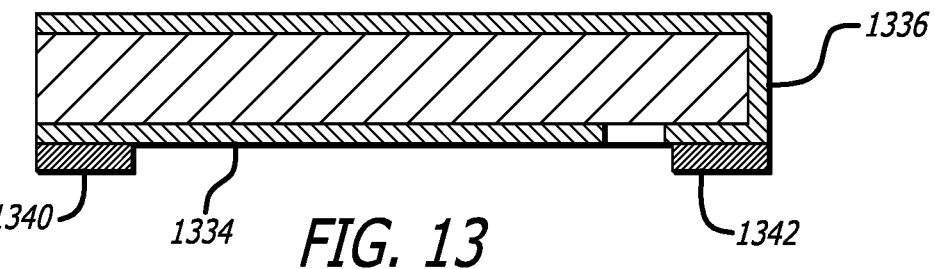
FIG. 13

METHOD OF MANUFACTURING PIEZOELECTRIC MICROACTUATORS HAVING WRAP-AROUND ELECTRODES

CROSS-REFERENCE TO RELATED APPLICATIONS

This application is a divisional of U.S. patent application Ser. No. 14/316,633 filed Jun. 26, 2014, which is a continuation of U.S. patent application Ser. No. 14/045,773 filed Oct. 3, 2013, now U.S. Pat. No. 9,406,314, which claims priority from Provisional Patent Application No. 61/709,573 filed Oct. 4, 2012, the disclosures of which are incorporated by reference as if fully set forth herein.

BACKGROUND OF THE INVENTION

1. Field of the Invention

This invention relates to the field of suspensions for hard disk drives. More particularly, this invention relates to a method of manufacturing piezoelectric microactuators having wrap-around electrodes such as for use in dual stage actuated (DSA) disk drive suspensions.

2. Description of Related Art

Magnetic hard disk drives and other types of spinning media drives such as optical disk drives are well known. FIG. 1 is an oblique view of an exemplary prior art hard disk drive and suspension for which the present invention is applicable. The prior art disk drive unit 100 includes a spinning magnetic disk 101 containing a pattern of magnetic ones and zeroes on it that constitutes the data stored on the disk drive. The magnetic disk is driven by a drive motor (not shown). Disk drive unit 100 further includes a disk drive suspension 105 to which a magnetic head slider (not shown) is mounted proximate a distal end of load beam 107. Suspension 105 is coupled to an actuator arm 103, which in turn is coupled to a voice coil motor 112 that moves the suspension 105 arcuately in order to position the head slider over the correct data track on data disk 101. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only voice coil motor 112 moves suspension 105.

In a DSA suspension, as for example in U.S. Pat. No. 7,459,835 issued to Mei et al. as well as many others, in addition to voice coil motor 112 which moves the entire suspension, at least one microactuator is located on the suspension in order to effect fine movements of the magnetic head slider to keep it properly aligned over the data track on the spinning disk. The microactuator(s) provide much finer control and much higher bandwidth of the servo control loop than does the voice coil motor alone, which effects relatively coarse movements of the suspension and hence the magnetic head slider. A piezoelectric element or component, made of piezoelectric material, sometimes referred to simply as a PZT, is often used as the microactuator motor, although other types of microactuator motors are possible. In the discussion that follows, for simplicity the microactuator will be referred to simply as a "PZT," although it will be understood that the microactuator need not be of the PZT type.

FIG. 2 is a top plan view of the prior art suspension 105 in FIG. 1. Two PZT microactuators 14 are affixed to suspension 105 on microactuator mounting shelves 18 that are formed within base plate 12, such that the PZTs span respective gaps in base plate 12. Microactuators 14 are affixed to mounting shelves 18 by non-conductive epoxy 16 at each end of the microactuators. The positive and negative electrical connections can be made from the PZTs to the suspension's flexible wiring trace and/or to the grounded base plate by a variety of techniques including those disclosed in commonly owned U.S. Pat. No. 7,751,153 to Kulangara et al.

In assembling a DSA suspension, the process typically includes the steps of: dispensing liquid adhesive such as epoxy onto the suspension and/or the PZT; positioning the PZT into place on the suspension; and curing the adhesive, typically by thermal curing, ultraviolet ("UV") curing, or other curing methods depending on the adhesive used. DSA suspensions often include both conductive epoxies and/or non-conductive epoxies to bond the PZT to the suspension. Conductive adhesives, such as silver-containing epoxies, are well known and are commonly used.

FIG. 3 shows a prior technique for bonding two PZTs in a DSA suspension including the electrical connection therebetween. FIG. 3 is not admitted as being "prior art" within the legal meaning of that term. Similarly, the processes described herein as applicable to FIG. 3 are also not admitted as being "prior art" within the legal meaning of that term. FIGS. 4 and 5 are cross sectional views taken along section lines C-C' and D-D' in FIG. 3, respectively, showing the details of the bonding. As best seen in FIG. 4, the PZT 330 has electrodes on both sides where the bottom electrode is grounded at one end by conductive epoxy 324 through gold 326 on grounded stainless steel 328 layer, and insulated at the other end by non-conductive epoxy 320. As best seen in FIG. 5, the top electrode is connected to a copper electrical contact pad 316 which is part of the suspension's electrical interconnect or flexible circuit and is insulated from the stainless steel substrate 312 by insulating layer 314 such as polyimide, by conductive epoxy 322 over non-conductive epoxy 320. Electrical contact pad 316 provides the driving voltage for PZT 330. Non-conductive epoxy 320 is primarily responsible for the mechanical bond between PZT 330 and stainless steel substrate 312. In general, the height of the conductive epoxy 322 for the top electrode is difficult to control, and the overall PZT attachment process requires three epoxy bonding steps, which is time consuming and costly. Also, two separate curing steps are required for the epoxy on the bottom electrode and on the top electrode.

There are drawbacks to the prior methods of bonding PZTs to suspensions. It can be difficult to control exactly how much epoxy is dispensed, where the adhesive ends up due to flow of the liquid adhesive, and other issues. Various solutions have been proposed that involve, for example, channels underneath the PZTs to control the flow of adhesive and to channel any excess liquid epoxy away from sensitive areas. U.S. Pat. No. 6,856,075 to Houk, for example, proposes an adhesive attachment that has one or more reliefs under or partially under or adjacent to a PZT transducer to control the flow of adhesive by limiting or influencing adhesive travel or flow and simultaneously preventing excessive adhesive fillet height adjacent the piezoelectric motor. Additionally, if the PZT is located at or near the gimbal which carries the magnetoresistive read/write head, it becomes critical to be able to predict and control the flow of adhesive because differences in adhesive flow and distribution from one part to another can adversely affect the geometries, mechanical properties, and resulting performance of the suspension. These issues are particularly pronounced when the PZT is located at a particularly sensitive part of the suspension such as near or at the gimbaled head slider. Repeatability and predictability are especially critical in that area. Still further, the presence of liquid epoxy and its dispensing equipment within the final assembly room represents both a potential source of contamination, as well as an additional and expensive manufacturing step.

Another drawback to the prior attachment means is the delays in assembly time required for multiple rounds of epoxy, including both conductive epoxy and non-conductive epoxy, to be dispensed and then cured. FIG. 6. illustrates the typical manufacturing process for PZT attachment, in which liquid epoxy is applied to the PZT, the interconnect, and/or the load beam before attaching the PZT. Conductive epoxy is dispensed at the interconnect (610), then non-conductive epoxy is dispensed at the load beam or other location for the PZT (612). The PZT is attached to the suspension (614), and the epoxy is then cured (616) in a first curing step. Next, conductive epoxy is dispensed again (618), and then cured (620) in a second curing step.

SUMMARY OF THE INVENTION

In order to address the foregoing disadvantages and other disadvantages of prior assembly processes, the present invention employs other types of adhesive than those traditionally used for DSA suspensions, and bonding and curing steps other than those traditionally used for DSA suspensions.

In one aspect, the invention employs adhesive films between the PZT and the suspension, and/or employs partially curing (B-staging) of a liquid or paste adhesive such as epoxy on the PZT before the PZT is placed onto the suspension component. The suspension component to which the PZT is affixed can be a base plate such as shown in FIGS. 1 and 2 for a baseplate mounted microactuator, a flexure such as shown in FIGS. 3-5 for a flexure mounted actuator, the suspension's load beam, the head slider itself in the case of a collocated PZT, or any other suspension component to which a microactuator motor may be mounted. After the two parts have been mated, the epoxy or other adhesive is finally cured. The curing can be thermal curing, UV curing, or other method of curing.

In a second aspect of the invention, the invention is of a method for producing a PZT microactuator or other electronic device having a wrap-around electrode, and of applying and using such a device. The wrap-around electrode is a conductive coating that wraps around at least part of the PZT to cover more than one face of the PZT, and thus conduct electricity to the opposite face. The wrap-around electrode simplifies both the assembly process and the final electrical connection(s) to the PZT in the completed suspensions. According to the method, a central electrode is first formed such as by sputtering on a first face of a wafer of piezoelectric material. A first side electrode on then formed on a first side or end of the wafer and over the adjacent edge, such that the first electrode extends onto the first face but is electrically not connected with, i.e., is discontinuous from, the central electrode on that face. Similarly, a second side electrode is also formed on a second side or end that is opposite the first side, with the second electrode also extending over an adjacent edge, such that the second electrode extends onto the first face but is also electrically discontinuous from the central. Conductive material is then deposited such as but sputtering on the second face of the wafer opposite the first face, with that conductive material extending to and being in electrical contact with the first and second side electrodes. The wafer now has one central electrode on the first face that covers most of the first face, and two side electrodes, with each side electrode covering not only its respective side but wrapping around that side and covering at least respective parts of the first and second faces, preferably at narrow respective strips on the first face on either side of the central electrode. The wafer is then cut in half. The result is two piezoelectric devices, each device having a wrap-around electrode such that the first face includes both electrodes. Both the drive and the ground connection can therefore both be made to the first face of the PZT, thus simplifying the electrical connections to it.

The invention simplifies the assembly process for a DSA suspension, and eliminates contamination sources in the sensitive final suspension assembly.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

BRIEF DESCRIPTION OF THE DRAWINGS

FIG. 8 is a perspective view of a DSA suspension minus the flexure gimbal assembly, according to an embodiment of the present invention that employs integrated adhesive patterns printed onto the PZT.

FIG. 9 is an exploded view of the suspension of FIG. 8.

FIG. 12 is a perspective view of the PZT in FIG. 11.

FIG. 13 is a side cut-away view of a PZT having a wrap-around electrode according to an additional embodiment of the invention.

DETAILED DESCRIPTION OF THE PREFERRED EMBODIMENTS

Figure 6:
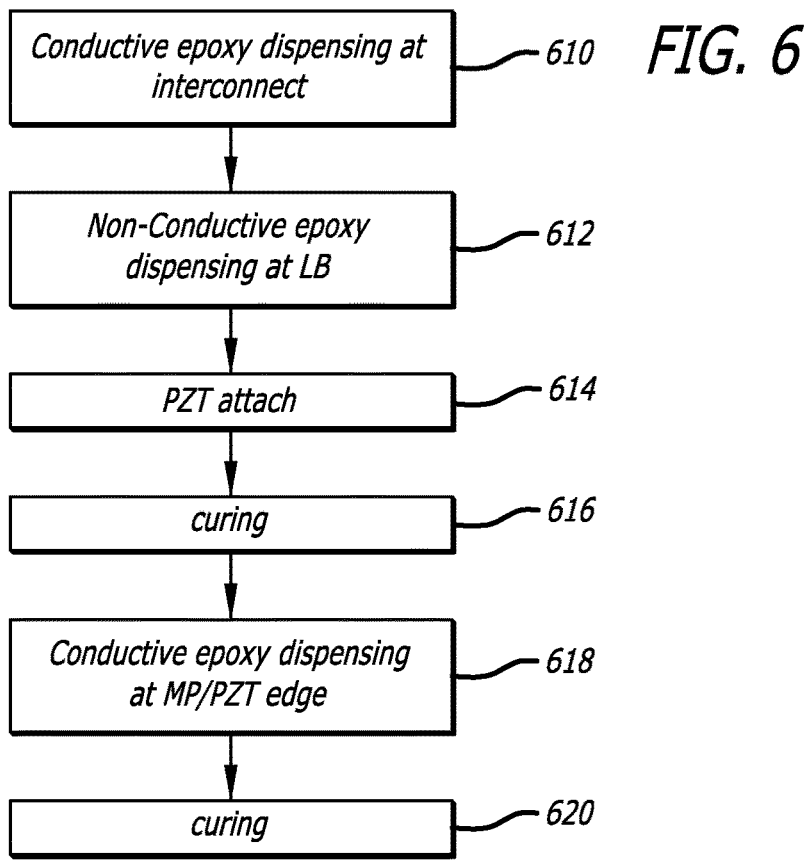
FIG. 6 is a process flow diagram of the process used to attach the PZT to the suspension in FIG. 3.
Figure 7:
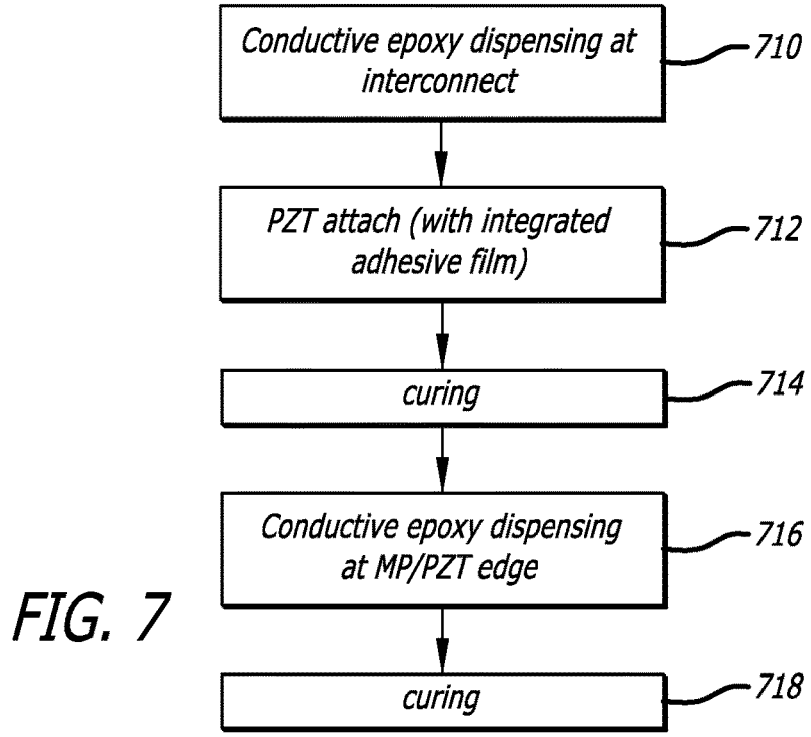
FIG. 7 is a process flow diagram of the simplified process used to attach a PZT to a suspension according to the invention.

A first aspect of the invention is the use of adhesive film to attach the PZT to the suspension. FIG. 7 illustrates the method. Conductive epoxy is dispensed at the interconnect (710). The PZT having the integrated adhesive film or other B-staged adhesive is then attached to the suspension (712), and the adhesive is then cured (714). Conductive epoxy is then dispensed at (716) and cured (718). The step of epoxy dispensing on the load beam is eliminated by using a PZT with integrated adhesive film. PZT with integrated adhesive film can be manufactured with either laminated adhesive film on it at the PZT wafer level or by printing or by a wafer backside coating process as used in the semiconductor industry. Because the adhesive film is attached to the PZT at the wafer level before dicing into individual PZT dies, process simplification and cost savings can be achieved. Also, tight control of the adhesive thickness can be achieved. As shown in FIG. 7 the use of a PZT with integrated adhesive also simplifies the process when compared to FIG. 6. The step of non-conductive epoxy dispensing at the load beam is eliminated using the method of the invention.

Figure 10:
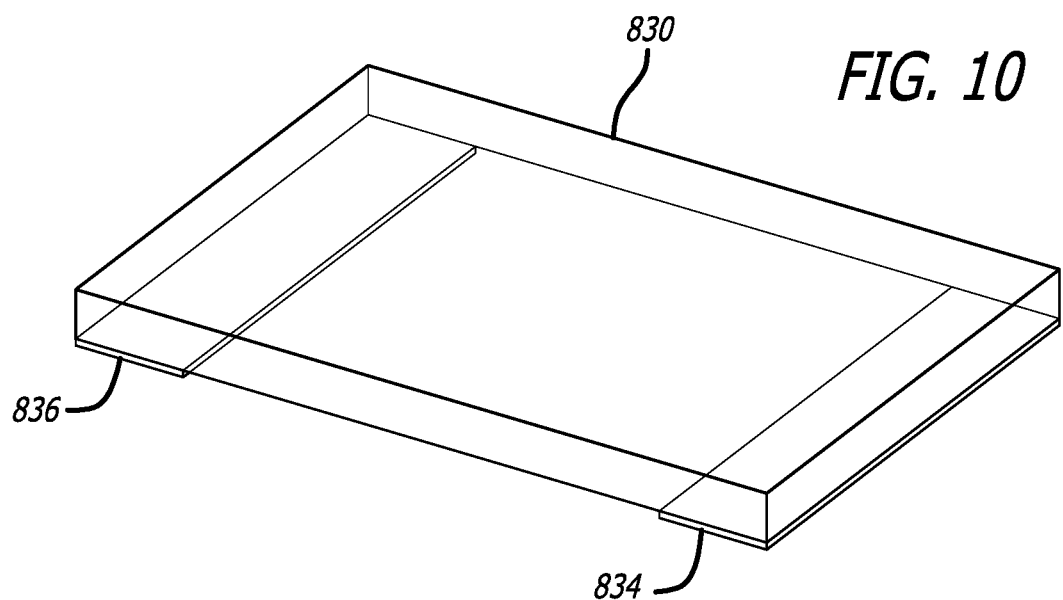
FIG. 10 is a perspective view of one of the PZTs of the suspension of FIG. 8, showing the integrated adhesive film underneath.

A suspension design that facilitates the use of integrated adhesive film is shown in FIGS. 8-10. FIG. 8 is a perspective view of a DSA suspension, less the flexure gimbal assembly for clarity of illustration, according to an embodiment of the present invention that employs integrated adhesive film or patterns printed onto the PZT. PZTs 830 are affixed to the suspension component to which it is mounted, in this case to baseplate 812. Actuation of the PZTs moves load beam 820 such that the head slider which is located at the distal end of the load beam moves radially.

FIG. 9 is an exploded view of the suspension of FIG. 8.

FIG. 10 is a perspective view of one of the PZTs 830 of suspension 810 of FIG. 8, showing the integrated adhesive film or printed adhesive 834, 836 underneath. In this embodiment, the integrated adhesive films 834, 836 located at both ends of PZT 830 are formed by applying adhesive film or printing adhesive patterns on the PZT wafers before dicing and singulation into individual PZT pieces. The exposed PZT surface between the adhesives will allow for electrical connection with liquid epoxy to the suspensions's electrical circuit.

Figure 11:
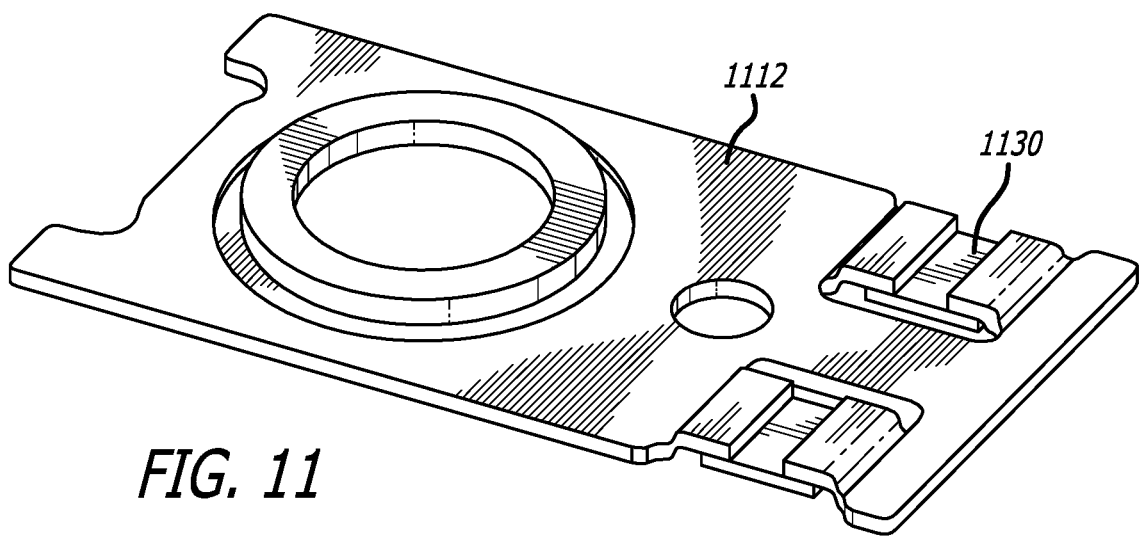
FIG. 11 is a perspective view of a portion of a DSA suspension according to an additional embodiment of the invention, in which integrated adhesive film is used on the top surface of the PZT.

FIG. 11 is perspective view of a portion of a DSA suspension according to an additional embodiment of the invention, in which integrated adhesive film is used on the top surface of PZTs 1130 in order to bond the PZTs to recessed portions of baseplate 1112.

FIG. 12 is a perspective view of the PZT in FIG. 11. In this design, the integrated adhesive film or printed adhesive 1134 is located at the top surface of the PZT. The integrated adhesive film covers the entire top surface, or substantially the entire top surface, and thus no patterning of the adhesive is required. Also, conductive adhesive film can be used in this design, such that the grounding through the base plate can be achieved once the PZT is attached to the base plate. This will further eliminate the required step of grounding the PZT to the baseplate with conductive liquid epoxy as shown in FIG. 6.

The adhesive film used can be either conductive or non-conductive, depending on whether an electrically conductive connection to the suspension or the interconnect circuit is desired, or a non-conductive connection to the suspension. Film adhesives are generally "preformed" or "B-staged," and are available in rolls, sheets, or die-cut shapes.

B-Staged Epoxy

In a slightly different embodiment, instead of applying adhesive film to the PZT and/or to the suspension, adhesive is applied to the PZT and is B-staged before final assembly.

The term "B-staged" or "B-staging" as used herein means, after a flowable adhesive has been dispensed, partially hardening the adhesive so that its flow rate is substantially reduced to the point that it no longer flows freely as a liquid, but is not so hard such that it is no longer available for effectively adhering to another surface. B-staging involves temporarily exposing the adhesive to an environment which causes accelerated hardening of the adhesive, then removing the adhesive from that environment such that the hardening rate slows down considerably so that the adhesive does not substantially harden during assembly. The removal of the PZT from that increased hardening environment can include simply removing the hardening accelerant from the environment. B-staging can cure or otherwise harden the adhesive to a degree such that the adhesive is no longer tacky. One method of B-staging is to partially cure a cross-linking polymer such as epoxy, such as by applying heat and/or UV, such that the epoxy achieves less than 10% cross-linking, then removing the curing source. For epoxies that are B-staged using heat, the epoxy may be immediately quenched down to a lower temperature at which cross-linking is negligible, i.e, at which the epoxy effectively ceases to harden, in order to stop the cross-linking process. For epoxies that are B-staged using UV, removing the PZT from the increased hardening environment can mean simply turning off the UV curing lamps.

With some adhesives, the adhesive may be mixed into a solvent to form a slurry, the solvent being one that evaporates at a lower temperature than which cross-linking begins to occur significantly. The adhesive may be a printable paste that is applied to the PZT. After dispensing, the adhesive is exposed to a specified thermal regime designed to evolve a majority of the solvent from the material without significantly advancing resin cross-linking. The result is an epoxy or other adhesive that no longer flows, but that is still available for adhering to another surface with the full or nearly full adherent strength of the epoxy.

B-staging an adhesive permits the adhesive and substrate construction to be "staged," or held for a period of time prior to the bonding and curing, without forfeiting performance. A secondary thermal cure cycle yields fully crosslinked, voidfree bonds. As used herein, the term "fully crosslinked" means at least 90% crosslinked.

The adhesive may take the form of a solid, thermosetting paste. The adhesive may be a printable paste that is printed by any known printing techniques that are suitable for use with adhesive, including screen printing, stencil printing, ink jet printing, spraying, stamping, and others. An advantage of using such printing techniques is that the adhesive can be dispensed in very fine and precise patterns onto the PZT, which helps to achieve control and repeatability of the adhesive's total mass and distribution within the finished suspension. One commercially available silver-filled conductive epoxy that is suitable for fluid jetting, screen printing, and stamping is EPO-TEK® H20E by Epoxy Technology, Inc. of Billerica, Mass.

A UV B-stage adhesive can be used. Such an adhesive is dispensed, then irradiated with UV energy in order to B-stage it. B-staging immediately after printing "freezes" the adhesives in position, which helps to precisely control any spread of the liquid epoxy. Unlike thermal staging, irradiating with UV energy eliminates the danger of advancing the thermoset reaction of the adhesive. UV B-staging can occur in seconds, while the thermal alternative can take an order of magnitude longer for the process.

Liquid epoxy or other adhesive may be first dispensed onto the PZT and/or onto the suspension, and then the epoxy is B-staged to the point that its flow is reduced to a negligible amount. The parts can then be assembled in the final, clean room assembly area for the disk drives, and the adhesive then fully cured either by heat or by UV. Such techniques have been used, or have been proposed to be used, in the integrated circuit (IC) packaging field under the broad term of wafer backside coating (WBC). Wafer backside coating techniques using both conductive and non-conductive adhesives can be adapted from die attach processes used in IC packaging to PZT attach processes for suspensions. Inkjet printing of polymers, both conductive and non-conductive, has also been proposed. Such inkjet printing techniques can be adapted for use in printing adhesives onto the PZTs for bonding those PZTs to suspensions.

It is anticipated that one method of production will be to begin with a wafer of PZT material, either applying already B-staged adhesive to it such as in adhesive film form or applying adhesive to it then B-staging the adhesive, then dicing the wafer into individual PZT microactuator motors. Pick-and-place machinery will be used to pick up the individual PZT die with the B-staged adhesive on it, assemble the PZT die to the suspension, and dwell there for the appropriate time and under the appropriate temperature and pressure conditions in order to fully cure the adhesive, and thus fully adhere the PZT to the suspension.

Wrap-Around Electrode

In another aspect, the invention is of a method of producing a piezoelectric microactuator or other electronic device having a wrap-around electrode, such that both the drive voltage and ground electrodes are located and accessible on the same side of the device.

FIG. 13 is a side cut-away view of a PZT according to an additional aspect of the invention. PZT 1330 has a bottom electrode 1334 and a "wrap-around" electrode 1336 that enables simplified electrical connections to the PZT. In this embodiment, the top electrode 1336 is wrapped around the PZT onto one end of the bottom PZT surface. The driving voltage is thus applied to the bottom surface of the PZT on a first end thereof, and the electrical ground is connected to the bottom surface on the opposite end. Thus, both electrodes 1334, 1336 can be electrically connected by conductive epoxy 1340, 1342, respectively, on the same surface or side of the PZT. This reduces the number of epoxy bonding steps to two steps and eliminates the difficult to control epoxy height tolerance on the top PZT surface. Also, only a single curing step is needed.

Figure 1:
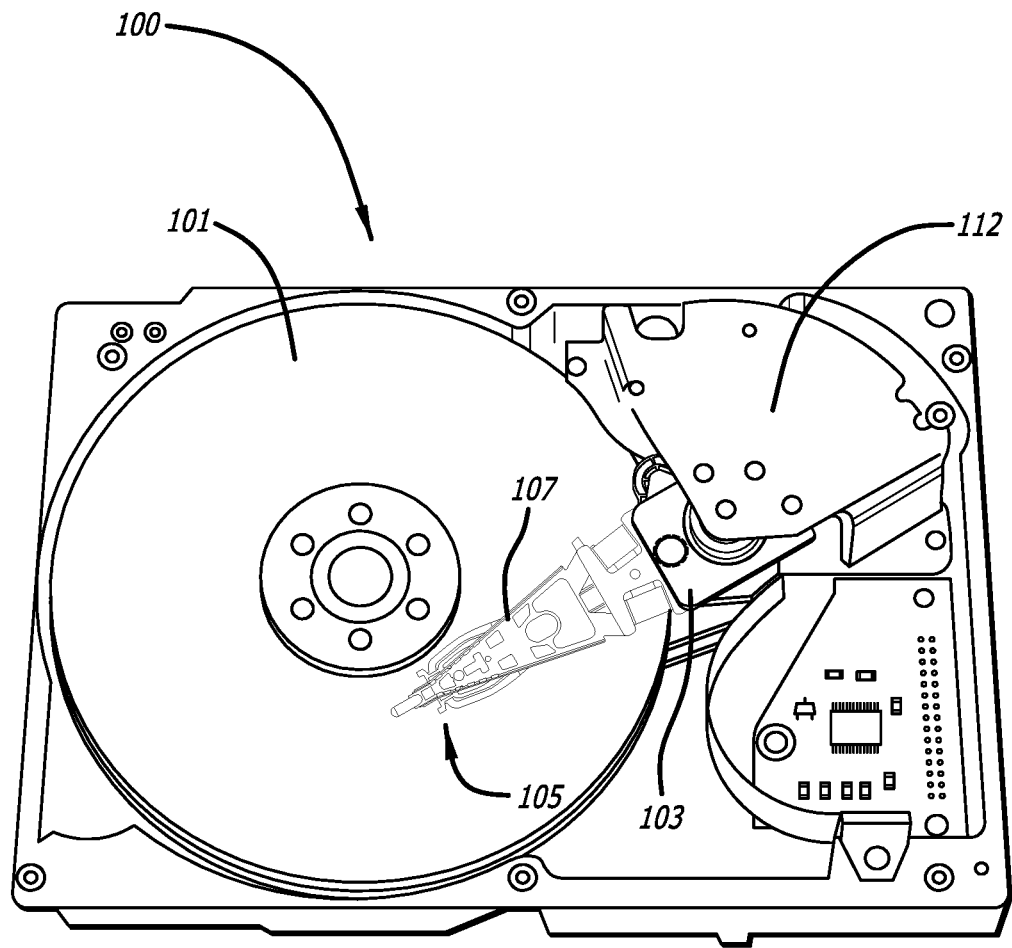
FIG. 1 is a perspective view of a prior art disk drive assembly having a DSA suspension.
Figure 2:
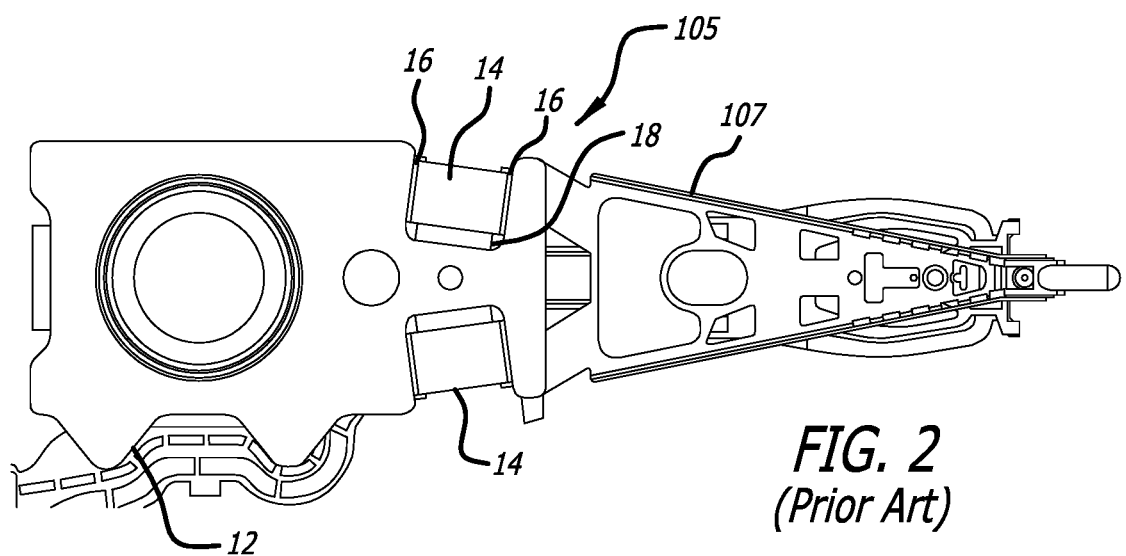
FIG. 2 is a top plan view of the prior art suspension 105 in FIG. 1.
Figure 3:
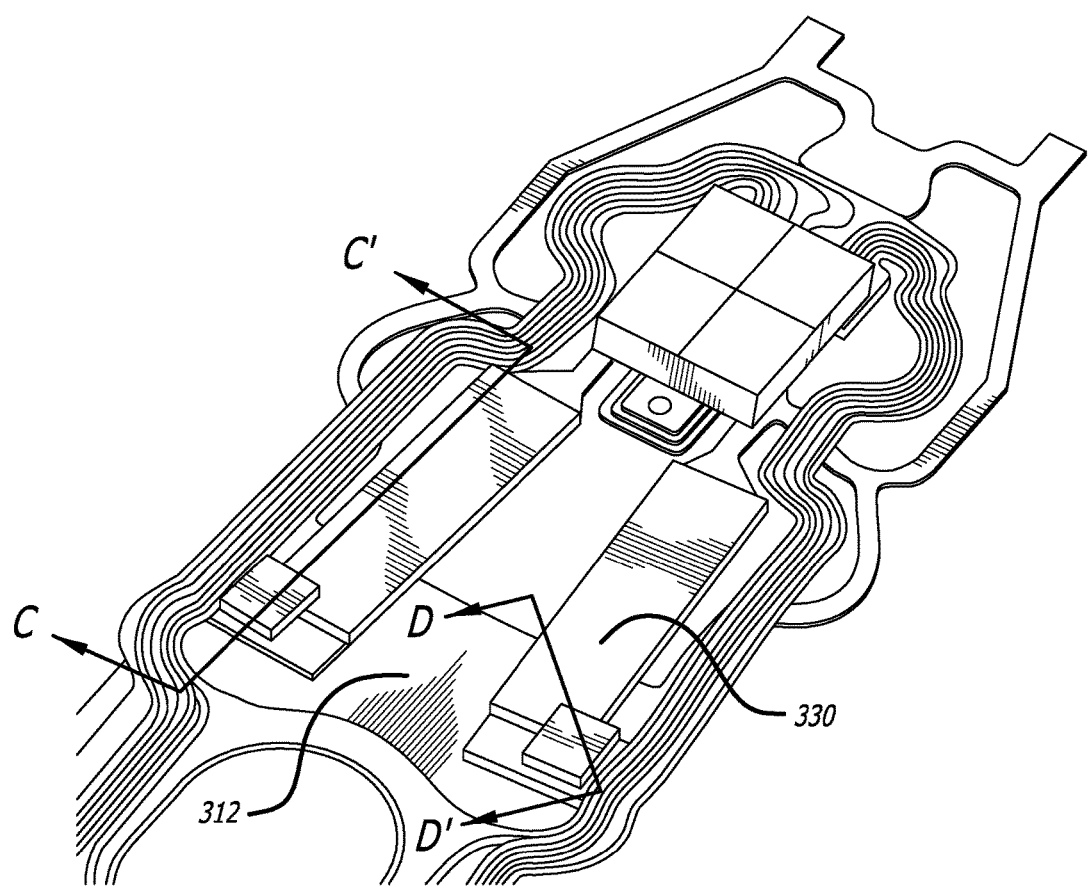
FIG. 3 is a perspective view of a prior DSA suspension to which the present invention is applicable.
Figure 4:
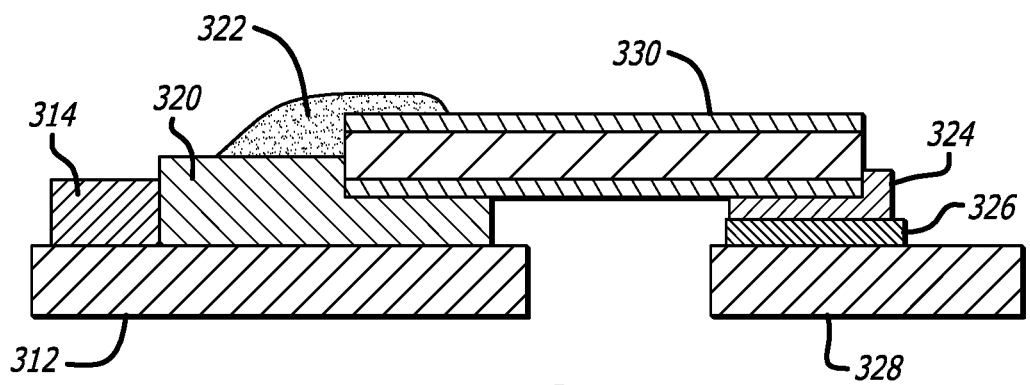
FIG. 4 is a sectional view taken along section line C-C' in FIG. 3.
Figure 5:
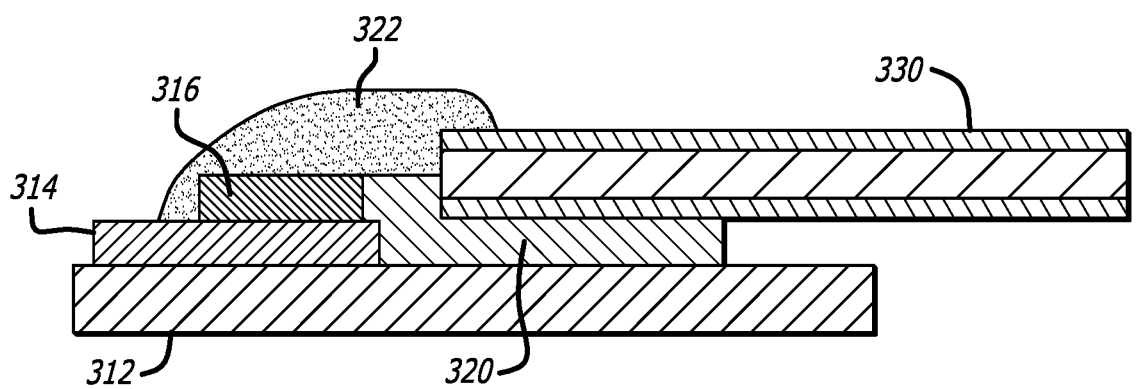
FIG. 5 is a sectional view taken along section line D-D' in FIG. 3.
Figure 14:
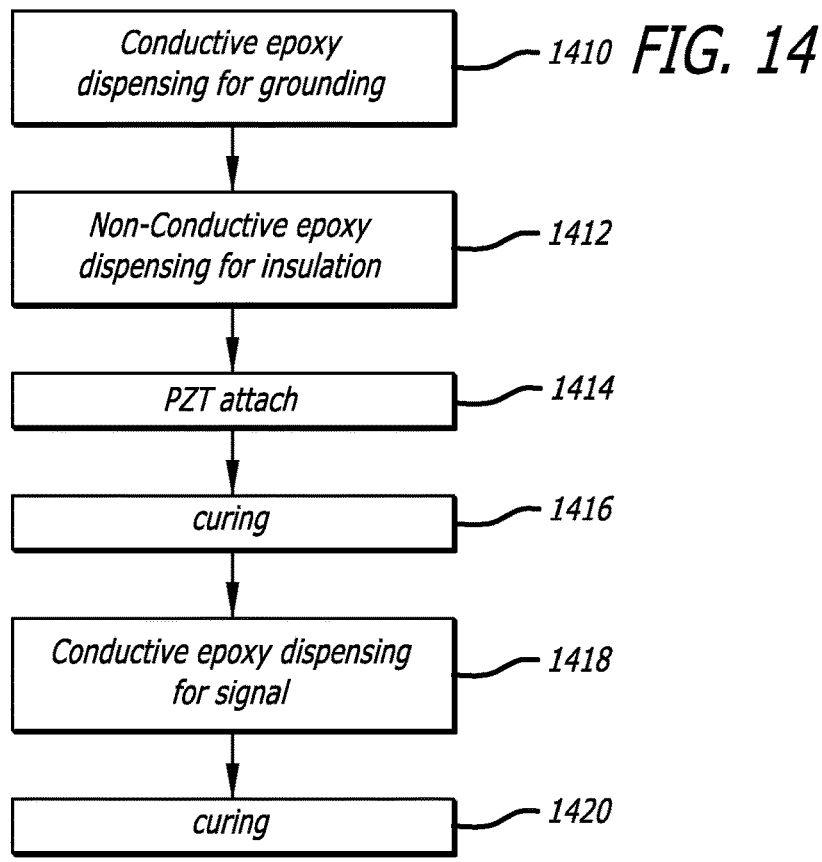
FIG. 14 is a process flow diagram for the prior epoxy dispensing and bonding steps for the PZT of FIG. 3

FIG. 14 is a flow diagram of a manufacturing process using prior epoxy dispensing and bonding steps for attaching the PZT to its suspension as shown in FIG. 3. Conductive epoxy is first dispensed for grounding (1410). Non-conductive epoxy is then dispensed for insulation (1412). The PZT is then attached to the suspension, at step 1414. The epoxies are then cured (1416). A second epoxy dispensing step is then performed (1418). Finally, that last-dispensed epoxy is cured (1420). The process required two separate curing steps.

Figure 15:
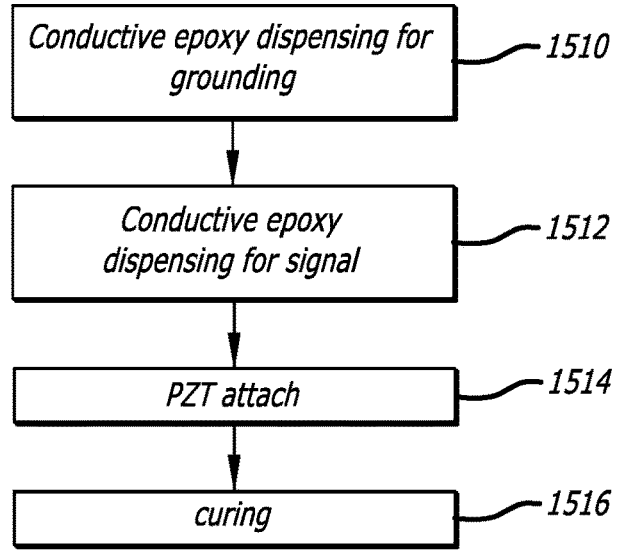
FIG. 15 is a process flow diagram for the prior epoxy dispensing and bonding steps and for the PZT of the present invention shown in FIG. 13.

FIG. 15 is a flow diagram of a manufacturing process according to the present invention for bonding the PZT to its suspension as shown in FIG. 13. Conductive epoxy is dispensed for grounding (1510). Conductive epoxy is then dispensed for the signal or driving voltage for the PZT (1512). The PZT is then attached to the suspension (1514). Finally, the assembly is cured (1516). The figures illustrate the simplification that is obtained by using a PZT with a wrap-around electrode according to the invention.

Figure 19:
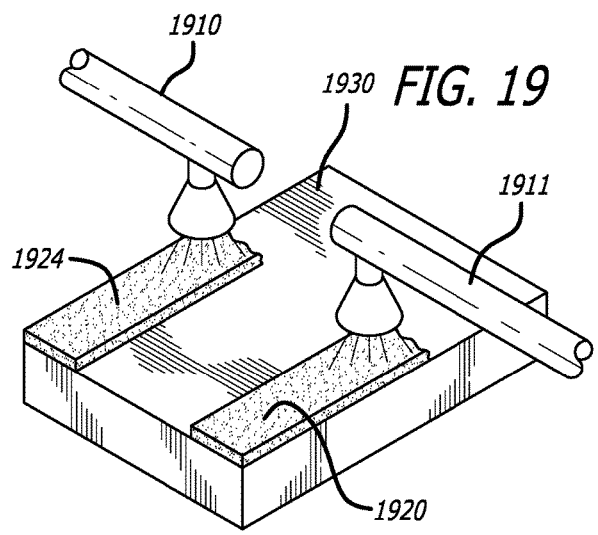
FIG. 19 is a perspective view of a PZT with adhesive being applied thereto according to the invention.
Figure 20:
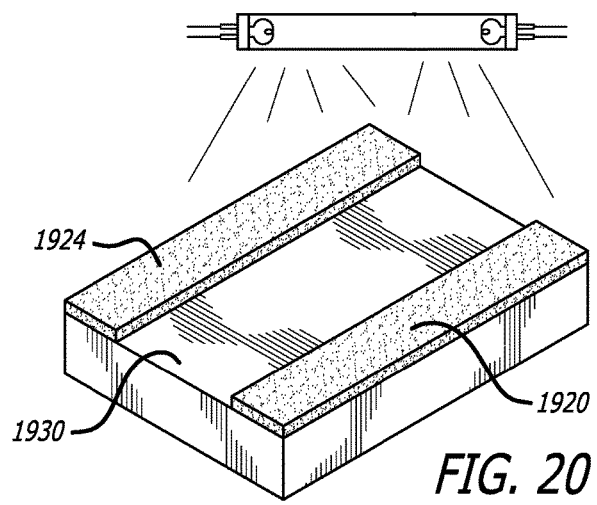
FIG. 20 is a top perspective view of the PZT of FIG. 19 illustrating the adhesives thereon being B-staged.
Figure 21:
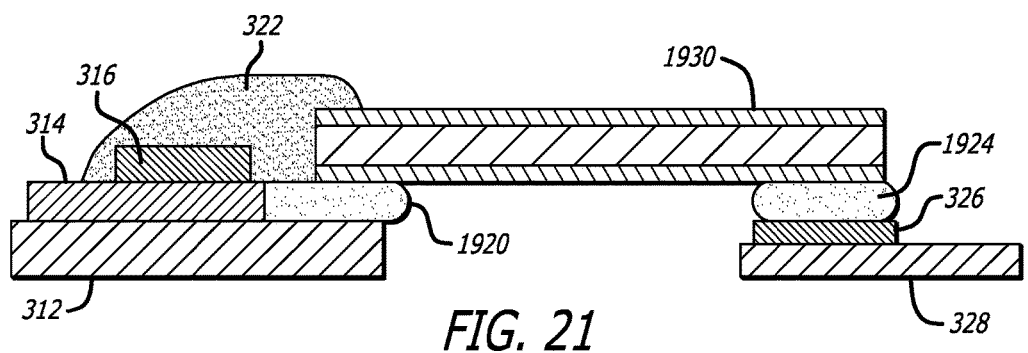
FIG. 21 is a side cutaway view of the PZT of FIG. 20 after it has been applied to a suspension.

FIGS. 19-21 illustrate the preparation and placement of a PZT having B-staged adhesive according to the invention. FIG. 19 is a perspective view of a PZT 1930 with adhesive 1920, 1924 being applied to what will be the bottom surface of PZT 1930. In general, the adhesive can be applied by any one of a number of known techniques including screen printing, stencil printing, ink jet printing, spraying, application as a film, and others. In general, any patterns desired of a combination of conductive adhesive and/or non-conductive adhesive may be applied to PZT 1930. In the illustrative embodiment shown, the adhesive is sprayed by ink jet heads 1910, 1911, to produce one strip of conductive epoxy 1924, and one strip of non-conductive epoxy 1920. The two strips can be of different thicknesses, with one strip being thicker than the other.

FIG. 20 is a top perspective view of PZT 1930 with the adhesives being B-staged. In the figure, the epoxy strips 1920, 1924 are being UV B-staged. In general, adhesives 1920, 1924 can be B-staged using any known technique including thermal B-staging and UV B-staging. Furthermore, the two strips of adhesive 1920, 1924 can be B-staged to different extents, leaving one strip more cured or hardened than the other. For UV curing, masks or screens can be used in order to irradiate one strip more than the other.

FIG. 21 is a side cutaway view of PZT 1930 after it has been applied to a suspension. FIG. 21 is analogous to FIG. 3 and illustrates how the present invention can simplify the prior process. After PZT 1930 has been positioned, pressure is applied to at least the left side of the PZT as seen in the figure in order to squeeze non-conductive epoxy 1920 so that it flows into the gap between the PZT and polyimide layer 314, and covers the previously exposed stainless steel 312 adjacent the PZT. The pressure could be applied by mechanically pressing on the PZT. Alternatively, depending on how much hardening occurred during the B-staging process, the weight of the PZT itself may provide sufficient force and pressure to squeeze non-conductive epoxy 1920 into that gap. After the PZT is positioned, and pressed down if necessary, conductive epoxy 322 is applied so as to bridge the gap between the metallized top surface of the PZT, which defines the drive electrode, and copper contact pad 316 which supplies the drive voltage to the PZT. All of the epoxy in the assembly is then cured at the same time in a single curing step. This process eliminates the need for a second curing step as was required for the assembly and process of FIGS. 3-6.

FIG. 21 represents only one of a number of possible different types of electrical connections and electrical connection methods for providing the PZT driving voltage and ground to the PZT. Many other connection types and methods are possible, such as disclosed in U.S. Pat. No. 8,189, 301 to Schreiber, and U.S. Pat. No. 7,751,153 to Kulangara. The present invention is applicable in suspensions that employ various types of electrical connections to the PZTs.

As an alternative to the bonding structure shown in FIG. 21, PZT 1930 could be extended farther to the left in the figure, such that the PZT is bonded directly to copper contact pad 316.

Figure 16A:
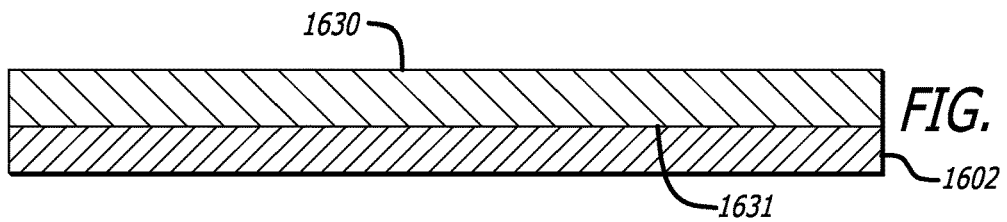
FIGS. 16A-16G illustrate the manufacturing steps for making the PZT with wrap-around electrode shown in FIG. 13.
Figure 16B:
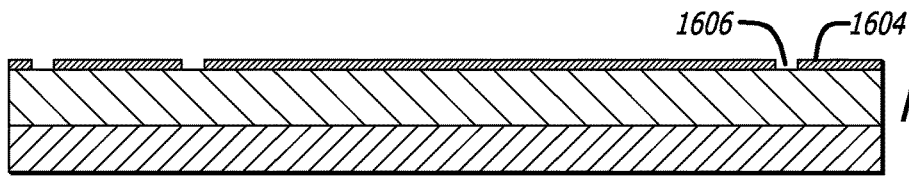
Figure 16C:
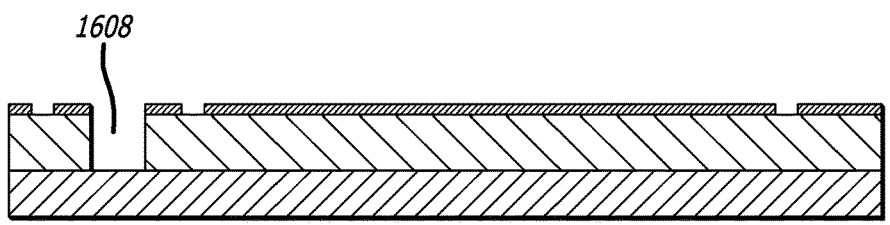
Figure 16D:
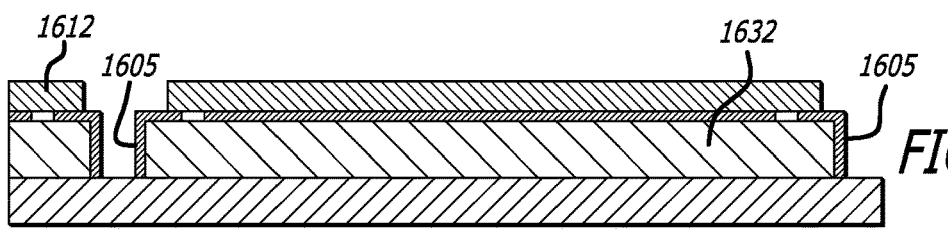

FIGS. 16A-16G illustrate the manufacturing steps for making the PZT with wrap-around electrode shown in FIG. 13. First, a PZT block or wafer 1630 is placed onto a transfer tape 1602, with PZT bottom surface 1631 facing downward (FIG. 16A). Next, an appropriate mask is placed over the top surface of the PZT wafer, and a metallization layer 1604 such as aluminum metallization is sputtered onto the top surface (FIG. 16B). The mask leaves strips 1606 of PZT surface not metallized. Kerf 1608 is then cut into the PZT wafer to separate a first portion, which will be referred to as a PZT precursor 1632, from the rest of the wafer (FIG. 16C). A second mask 1612 is placed over PZT precursor 1632, and additional metallization 1605 is sputtered into the kerfs onto the sides of PZT precursors 1632 within kerfs 1608 in order to make those sides electrically conductive and electrically continuous with the metallizations on the top surface of the PZT adjacent the kerfs (FIG. 16D).

Figure 16E:
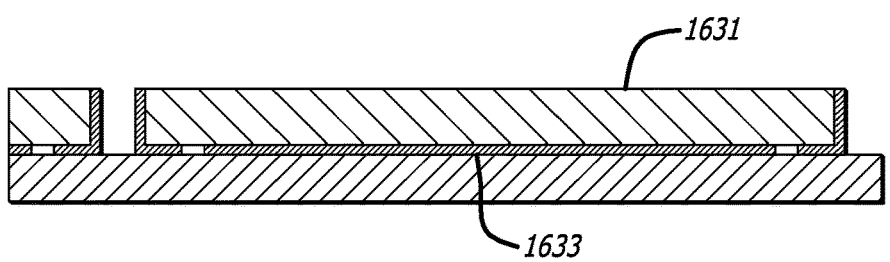
Figure 16F:
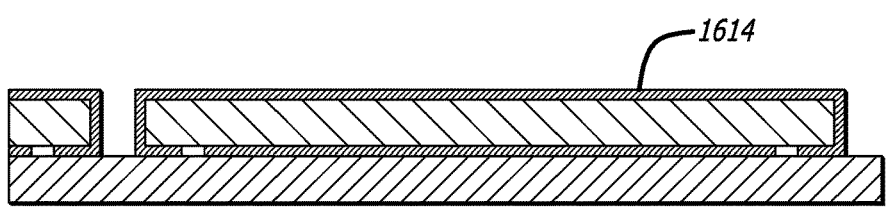
Figure 16G:
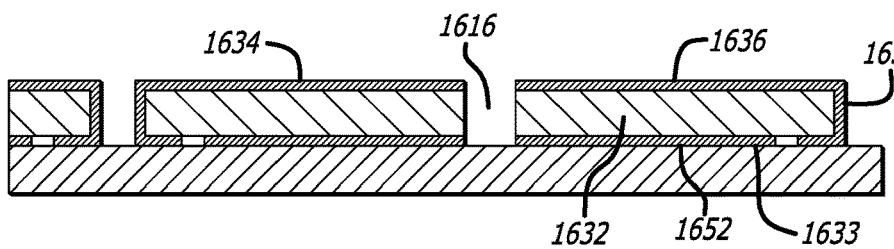

Next, the PZT precursor 1632 is flipped over and preferably placed onto a second transfer tape in order to expose what had been the bottom surface 1631 of the PZT precursor (FIG. 16E). That bottom surface 1631 will continue to be referred to as the bottom surface even though it is now facing upward. A metallization layer 1614 is then sputtered onto the entire bottom surface 1631 of the PZT precursor (FIG. 16F). Finally, a new cut 1616 is made into the PZT, separating the first PZT generally in half and defining what will be referred to as first PZT 1634 and second PZT 1636 (FIG. 16G).

The result of this process is two PZTs 1634, 1636 each of which has the same structure. A narrow stripe of metallization 1650 on the first PZT's top surface 1633 and near its end, defines a first electrode. The first electrode 1650 electrically wraps around via the metallized side surface 1605 of the PZT to the bottom surface 1631 of the PZT and to the metallization 1604 that generally covers bottom surface 1631. A second electrode 1652 on the top surface 1633 of the first PZT covers most, but not all, of the PZT top surface 1633. In this way, a first PZT has been constructed whose first electrode 1650 is located on the same surface of the first PZT as the second electrode 1652. Generally speaking, the first electrode can be the electrode at which the PZT drive voltage is applied with the second electrode being the electrode at which the PZT is grounded, or vice versa. The second PZT is substantially identical to the first PZT.

Figure 17A:
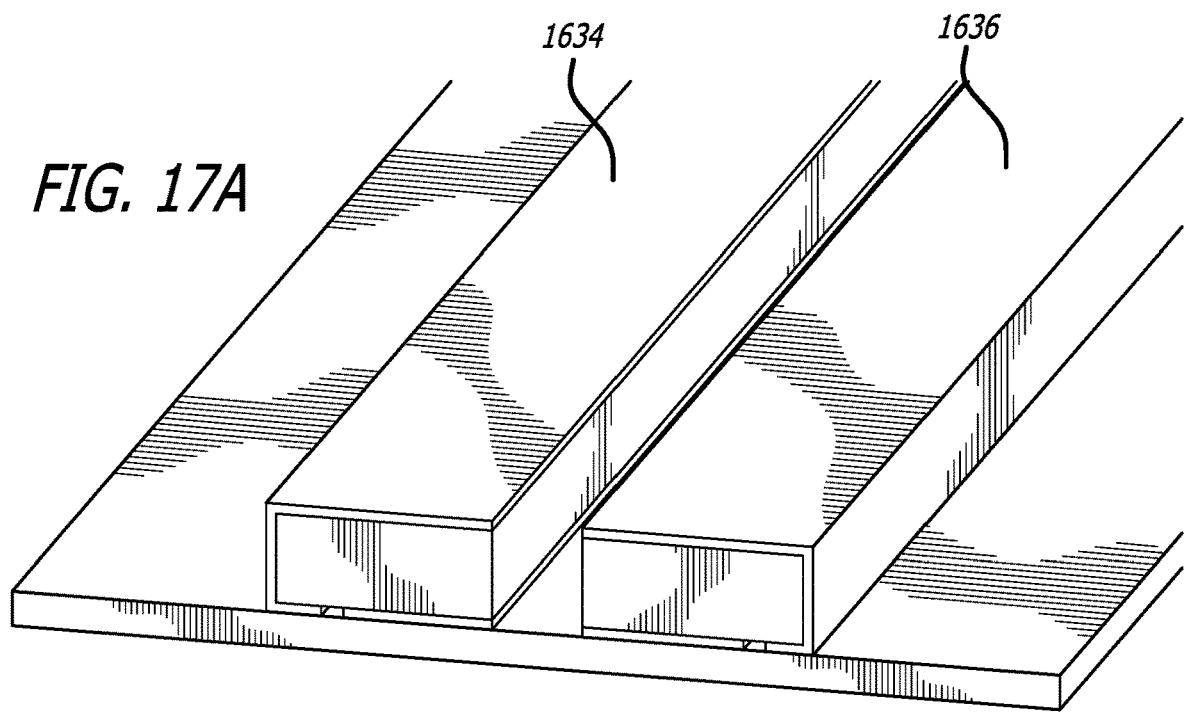
FIGS. 17A and 17B are isometric views of a PZT wafer at selected steps during the manufacturing process according to the present invention.
Figure 17B:
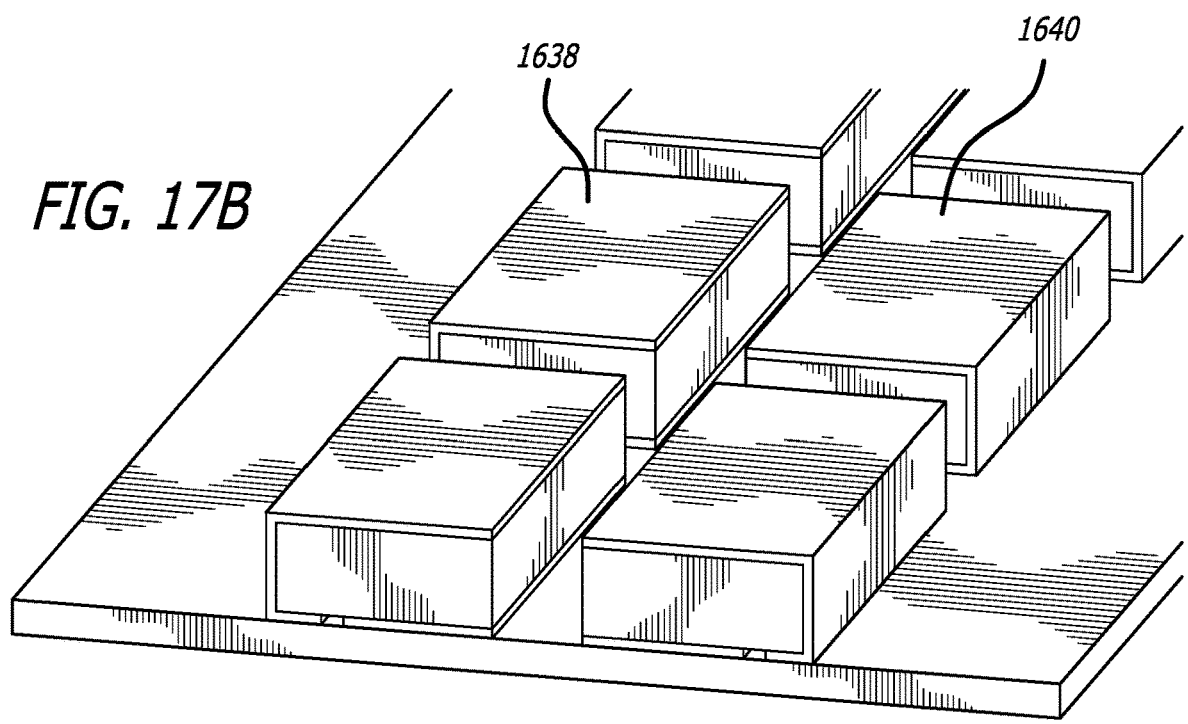

FIGS. 17A and 17B are isometric views of a PZT wafer at selected steps during the manufacturing process according to the present invention. FIG. 17A is an isometric view of the PZT strips 1634, 1636 at the end of the process in FIG. 16. Now, the PZT is ready for poling; the final dicing operation can be performed afterward to create the individual PZTs as shown in FIG. 17B. The result is a first row of PZTs 1638 and a second row of PZTs 1640, both having wrap-around electrodes.

Figure 18A:
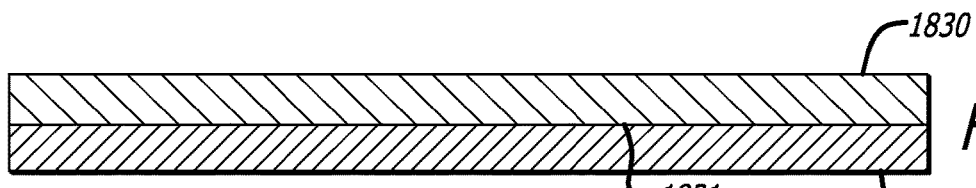
FIGS. 18A-18G show an alternative manufacturing process that could be used to produce the PZT of FIG. 13.
Figure 18B:
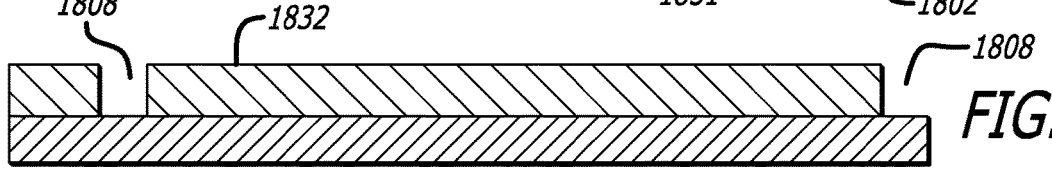
Figure 18C:
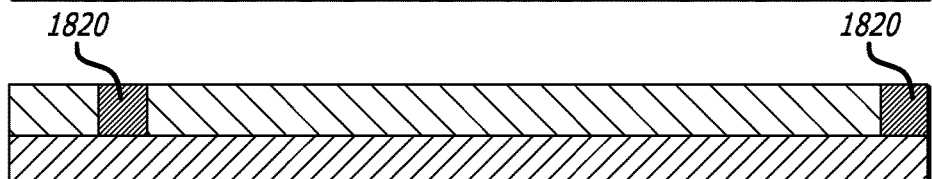
Figure 18D:
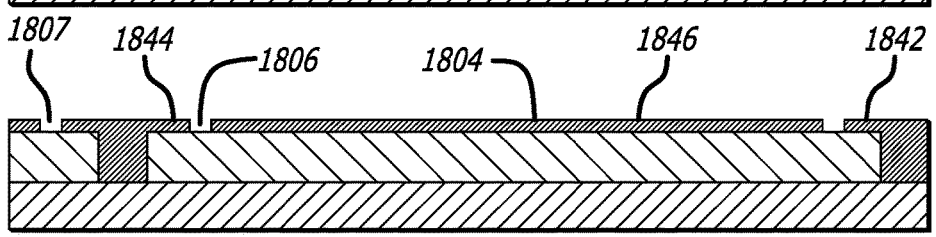

FIGS. 18A-18G illustrate alternative manufacturing steps for making the PZT having a wrap-around electrode. The PZT wafer 1830 is placed onto a transfer tape 1802 with its bottom surface 1831 facing downward (FIG. 18A). Kerfs 1808 are then cut into PZT 1830 to separate a first portion, which will be referred to as a PZT precursor 1832, from the rest of the wafer (FIG. 18B). The kerfs 1808 on either side of PZT precursor 1832 are then filled with a conductive and hardenable material 1820, such as conductive epoxy paste containing copper, silver, or other conductive material or particles (FIG. 18C). Silver epoxy is one such commonly used material, and will be used as an example. Silver epoxy 1820 is then allowed to harden. Next, an appropriate mask is placed over the top surface of PZT precursor 1832, and a metallization layer 1804 such as aluminum metallization is sputtered onto the top surface (FIG. 18D). The mask prevents metallization along two narrow strips 1806, 1807 on the top surface of the PZT precursor near the ends thereof. The result is that the PZT precursor 1832 has two relatively narrow stripes of metallization 1842, 1844 on the top surface of the PZT precursor near either end thereof, and a large metallization area 1846 generally centered on the PZT precursor. At this point in the process, each stripe of metallization 1842, 1844 near an end of the PZT precursor is electrically connected to the silver epoxy 1820 on the end of the PZT precursor to which that stripe is adjacent, and each of the two stripes of metallization 1842, 1844 and the large metallized region 1846 in the center are all electrically isolated or electrically discontinuous from each other.

Figure 18E:
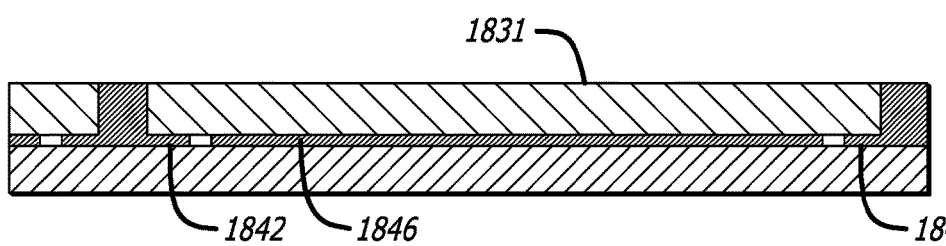
Figure 18F:
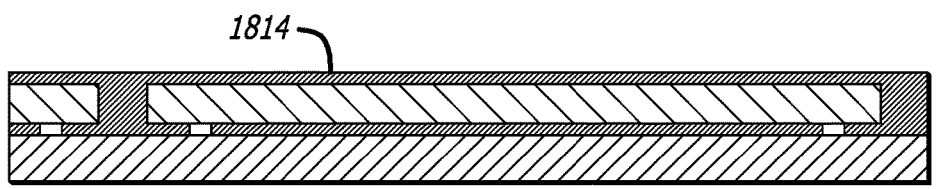
Figure 18G:
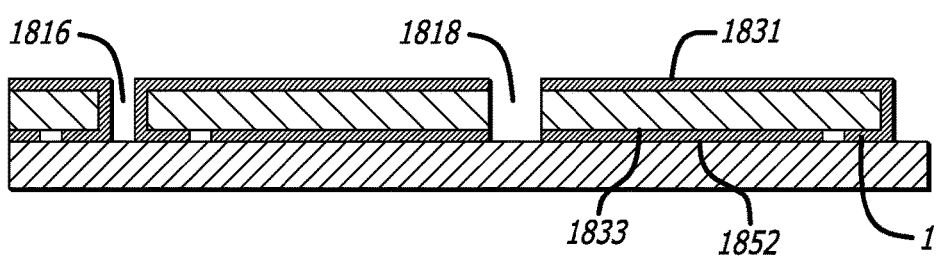

Next, the PZT precursor is flipped over and preferably placed onto a second transfer tape in order to expose what had been the bottom surface 1831 of the PZT precursor (FIG. 18E). That bottom surface 1831 will continue to be referred to as the bottom surface even though it is now facing upward. A metallization layer 1814 is then sputtered onto the entire bottom surface of the PZT precursor (FIG. 18F). Finally, a new cut 1818 is made into the PZT precursor, cutting the PZT precursor generally in half, and another cut 1816 is made through the silver epoxy, thereby separating the PZT precursor in half and defining what will be referred to as first and second PZTs (FIG. 18G). The cut 1816 is within kerf 1808 and is narrower than kerf 1808 so as to leave the side of the PZT precursor covered with conductive silver epoxy 1820, and thus serves as an electrical bridge or wrap-around from the PZT's top surface to its bottom surface.

The result of this process is two PZTs each of which has the same structure. A narrow stripe of metallization 1844 on the first PZT's top surface 1833 and near its end, defines a first electrode. The first electrode 1844 electrically wraps around via the silver epoxy 1820 to bottom surface 1831 of the PZT and to the metallization that generally covers bottom surface 1831. A second electrode 1852 on the top surface 1833 of the first PZT covers most, but not all, of the PZT top surface 1833. In this way, a first PZT has been constructed whose first electrode 1844 is located on the same surface of the first PZT as the opposite electrode 1852. The second PZT is substantially identical to the first PZT.

Figure 22:
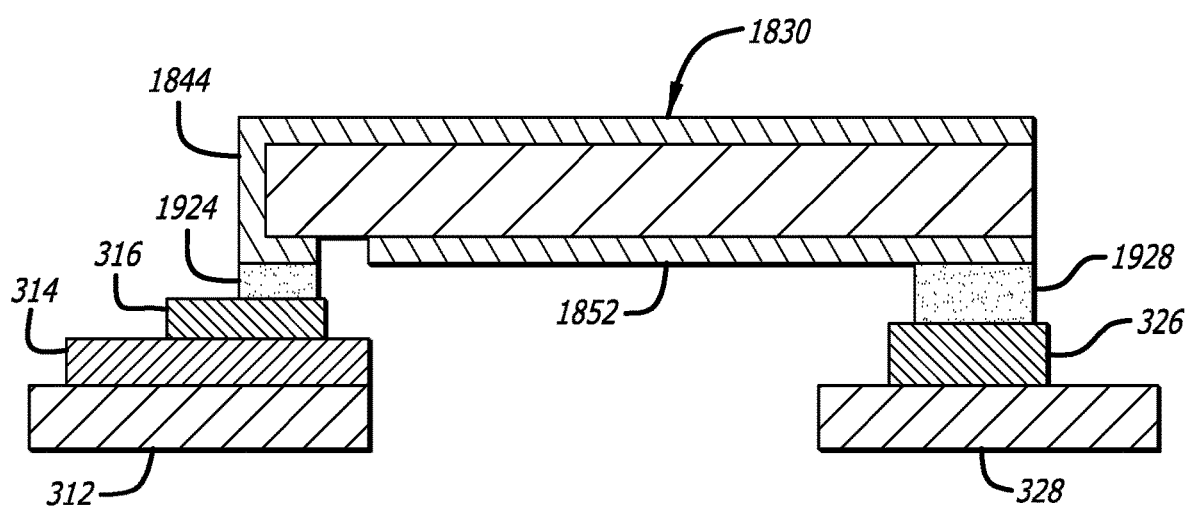
FIG. 22 is a side cutaway view of the PZT having a wrap-around electrode after it has been applied to a suspension.

FIG. 22 is a side cutaway view of the PZT having a wrap-around electrode such as the PZTs of either FIG. 16G or FIG. 18G, after it has been applied to a suspension. PZT 1830 has a first and wrap-around electrode 1844 which serves as the drive or positive electrode, and a second electrode 1852 which serves as the ground electrode. Drive electrode 1844 is bonded to copper contact pad 316 on polyimide layer 314 over stainless steel substrate 312, via conductive epoxy 1924. Ground electrode 1852 is grounded to stainless steel substrate 328 via gold bond pad 326 and conductive epoxy 1928. Strips of conductive epoxy 1924 and 1928 can be B-staged epoxies as discussed above, with the epoxies fully cured after the parts have been assembled as shown in the figure. This embodiment completely eliminates the need to dispense any epoxy within the suspension assembly room, and eliminates any liquid or paste epoxy from that room, and thereby helps to keep that environment free from contamination.

It will be understood that the terms "generally," "approximately," "about," and "substantially," as used within the specification and the claims herein allow for a certain amount of variation from any exact dimensions, measurements, and arrangements, and that those terms should be understood within the context of the description and operation of the invention as disclosed herein.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise. Thus, unless expressly stated otherwise, each feature disclosed is one example only of a generic series of equivalent or similar features.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. For example, instead of selectively applying and partially curing adhesive on the PZT, adhesively could be selectively applied and partially cured on other suspension components such as the flexure. Accordingly, it is to be understood that the detailed description and the accompanying drawings as set forth hereinabove are not intended to limit the breadth of the present invention.

We claim:

1. A method of manufacturing a piezoelectric microactuator, the method comprising:
    (a) forming a central electrode on a first face of a wafer of piezoelectric material, the wafer having opposite first and second faces and opposite first and second sides, the wafer further having first and second edges where the first face and second meets the first and second sides, respectively;
    (b) forming a first side electrode on the first side and over the first edge, the first side electrode extending onto the first face but being electrically discontinuous from the central electrode;
    (c) forming a second side electrode on the second side and over the second edge, the second side electrode extending onto the first face but being electrically discontinuous from the central electrode;
    (d) depositing a conductive material on the second face of the wafer opposite the first face, the conductive material extending to the first and second side electrodes;
    (e) whereby the wafer has a central electrode on the first face thereof, and first and second side electrodes each of which wraps from the first face around respective opposite sides of the wafer and to the second face;
    (f) cutting the wafer into two piezoelectric devices, each piezoelectric device having two electrodes, a first of which is located on the first face and a second of which wraps around from first face of the piezoelectric device to the opposite and second face thereof.

2. The method of claim 1 wherein the central electrode is formed by sputtering with a mask to form the central electrode and respective portions of the two side electrodes on either side of the central electrode, each of the two side electrode portions being electrically discontinuous from the central electrode.

3. The method of claim 2 wherein step (b) includes:
    applying a mask to the first face;
    sputtering metallization onto the first face of the wafer;
    cutting a kerf into the wafer; and
    sputtering metallization onto the first and second edges of the wafer.

4. The method of claim 3 further comprising:
    before step (a), placing the wafer on a transfer tape with the second face of the wafer facing the tape; and
    before step (d), flipping the wafer over so that its first face is facing downward.

5. The method of claim 2 wherein step (b) includes:
    cutting first and second kerfs in the wafer;
    filling the kerfs with conductive paste and hardening the paste;
    applying a mask to the first face and sputtering metallization onto the face and onto the conductive paste to form the central electrode and the two side electrodes, the two side electrodes being electrically discontinuous from the central electrode; and
    cutting third and fourth kerfs within the first and second kerfs, respectively, the third and fourth kerfs being narrower than the first and second kerfs, leaving the first and second ends of the wafer covered with the conductive paste after the third and fourth kerfs are cut.

6. A method of manufacturing a piezoelectric microactuator, the method comprising:
    (a) forming a kerf in a piezoelectric block to separate the piezoelectric element into at least first and second piezoelectric elements, the kerf extending from a top surface of the first piezoelectric element to a bottom surface thereof;
    (b) applying a first conductive material into the kerf;
    (c) applying a second conductive material to the top surface of the first piezoelectric element so as to cover both a majority of the top surface of the first piezoelectric element, and so as to establish electrical connectivity between the first conductive material in the kerf and at least a portion of the top surface adjacent the kerf;

(d) forming an electrical discontinuity in the second conductive material so as to electrically isolate said second conductive material covering the majority of the top surface from said portion of the second conductive material adjacent the kerf;

(e) applying a third conductive material on the bottom surface of the first piezoelectric element, the third conductive material establishing electrical connectivity between said bottom surface and the first conductive material in the kerf;

(f) whereby electrical connectivity is established between the bottom surface of the first piezoelectric element and at least said portion of the top surface thereof adjacent the kerf, and electrical connectivity is not established between the bottom surface of the first piezoelectric element and said majority of the top surface, thereby defining a first piezoelectric element having a wrap-around electrode.

7. The method of claim 6 further comprising:

(g) cutting the first conductive material within the kerf thereby separating the first and second piezoelectric elements, a first half defining a first piezoelectric microactuator having a first electrode on a majority of its top surface, and further having a second electrode on its bottom surface that wraps around to at least a portion of its top surface, the first and second electrodes being electrically discontinuous and defining first and second electrodes for actuating the microactuator by applying an electric potential across the first and second electrodes, and wherein the electric potential may be applied across two points both of which are on the top surface of the piezoelectric microactuator.

8. The method of claim 7 further comprising:

(h) cutting through the first piezoelectric element at a locus within said majority of the top surface thereby separating the first piezoelectric element into first and second halves, the two halves defining first and second microactuators each having their own wrap-around electrodes.

9. The method of claim 6 wherein the first conductive material in the kerf is hardenable conductive adhesive, and the second and third conductive materials are metallization layers.

10. The method of claim 6 further comprising:

(i) after steps (c) and (d) but before step (e), flipping the first piezoelectric element thereby exposing the bottom surface therefore for application of the third conductive material thereto.

* * * * *